(12) United States Patent
Cheng et al.

(10) Patent No.: US 7,808,075 B1
(45) Date of Patent: Oct. 5, 2010

(54) INTEGRATED CIRCUIT DEVICES WITH ESD AND I/O PROTECTION

(75) Inventors: Chuan-Cheng Cheng, Fremont, CA (US); Choy Hing Li, Saratoga, CA (US); Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 505 days.

(21) Appl. No.: 11/505,782

(22) Filed: Aug. 16, 2006

Related U.S. Application Data

(60) Provisional application No. 60/765,968, filed on Feb. 7, 2006.

(51) Int. Cl.
   *H01L 23/58* (2006.01)
(52) U.S. Cl. .................. 257/528; 257/724; 257/777
(58) Field of Classification Search ................... None
   See application file for complete search history.

(56) References Cited

U.S. PATENT DOCUMENTS

| | | | |
|---|---|---|---|
| 6,180,426 B1* | 1/2001 | Lin | 438/15 |
| 6,303,996 B2* | 10/2001 | Lin | 257/777 |
| 6,914,259 B2* | 7/2005 | Sakiyama et al. | 257/48 |
| 7,378,735 B2* | 5/2008 | Lin | 257/738 |
| 2003/0076639 A1* | 4/2003 | Chen | 361/56 |

OTHER PUBLICATIONS

Chuan-Cheng Cheng, Choy Hing Li and Shuhua Yu: Integrated Circuit Devices with ESD Protection in Scribe Line, and Methods for Fabricating Same; U.S. Appl. No. 11/521,731; filed Sep. 14, 2006.

* cited by examiner

*Primary Examiner*—Alonzo Chambliss

(57) ABSTRACT

The integrated circuit devices disclosed herein generally include two semiconductor dies. The first die generally has little or no I/O or ESD protection and includes a first plurality of exposed terminals (e.g., bump pads). The second die generally includes (i) a second plurality of exposed terminals, wherein at least one of the second plurality of terminals is in electrical communication with one or more of the first plurality of terminals, (ii) a plurality of input and/or output (I/O) circuits, wherein at least one of the I/O circuits is in electrical communication with one or more of the second plurality of terminals, and (iii) a plurality of I/O terminals, wherein at least one of the I/O terminals is in electrical communication with one or more of the I/O circuits. The present invention advantageously provides the ability to fabricate the second die using different (e.g., less expensive) manufacturing processes than those used to fabricate the first die.

51 Claims, 10 Drawing Sheets

INTEGRATED CIRCUIT DEVICES WITH ESD AND I/O PROTECTION

RELATED APPLICATIONS

This application claims the benefit of U.S. Provisional Application No. 60/765,968, filed Feb. 7, 2006, incorporated herein by reference in its entirety.

FIELD OF THE INVENTION

The present invention generally relates to the field of integrated circuit devices. More specifically, embodiments of the present invention pertain to integrated circuit devices with electrostatic discharge (ESD) and/or input/output (I/O) protection, systems incorporating such integrated circuit devices, and methods for manufacturing and testing the same.

DISCUSSION OF THE BACKGROUND

In semiconductor manufacturing, the cost of a semiconductor die generally corresponds to its size. As components in semiconductor dies become smaller, the dies themselves can shrink, and more dies can be produced from a single semiconductor wafer. Thus, the cost of die may decrease even if the smaller manufacturing process is marginally more expensive. However, some structures have a size relatively independent of the minimum feature size of the technology (or at least less dependent on minimum process dimensions than other components). Structures such as electrostatic discharge protection devices, wire bond pads, input and/or output (I/O) bond pads, I/O driver circuits, voltage regulators, capacitors, inductors, etc. may have a relatively constant size even as other components shrink.

Integrated circuit devices typically require some kind of protection against overvoltages (e.g., electrostatic discharges) that may be inadvertently applied to a terminal thereof. For example, both externally-applied DC and alternating current (AC) power sources are configured to provide a nominal power supply, or standard voltage, to an integrated circuit (IC) for its operation. On occasion, these power sources may pass transient or sustained voltages significantly above nominal to the IC. In addition, human handlers and/or electronic equipment may carry or generate a significant static electrical charge, sometimes on the order of a thousand to two thousand volts or more. For example, when such a human handler inadvertently touches the leads of an IC and passes such a high static charge to an input buffer on the IC, significant (and sometimes fatal) damage can be done to the IC if the IC is without some kind of protection against such ESD.

Currently, ESD protective structures and wire bond pads may consume a substantial portion of a semiconductor die manufactured using modern manufacturing processes (e.g., 0.13 µm, 90 nm, 65 nm, etc.). Thus, these larger structures may be relatively more expensive to produce in a smaller manufacturing process than in an older manufacturing process (e.g., 0.18 µm, 0.25 µm, etc.). The present invention facilitates the use of less advanced process technology to form structures that do not fully benefit from more advanced process technology.

SUMMARY OF THE INVENTION

Embodiments of the present invention relate to an integrated circuit (IC) device, systems incorporating the IC device, an apparatus for testing one of the die of the IC device, and methods for forming and protecting the integrated circuit device. The integrated circuit device generally comprises two semiconductor dies. The first die generally includes active circuit components (e.g., transistors, switches, functional circuit blocks, etc.) and a first plurality of exposed terminals (e.g., bump pads, ball bands, or ball bond pads). The first die may implement, for example, application specific integrated circuits [ASICs], microprocessors, system-on-chip [SOC] architectures, etc. The first die also generally has little or no ESD protection structures or circuits thereon. The second die generally includes (i) a second plurality of exposed terminals, wherein at least one of the second plurality of terminals is in electrical communication with one or more of the first plurality of terminals, (ii) a plurality of input and/or output (I/O) circuits, wherein at least one of the I/O circuits is in electrical communication with one or more of the second plurality of terminals, and (iii) a plurality of I/O terminals, wherein at least one of the I/O terminals is in electrical communication with one or more of the I/O circuits. The systems generally comprise those that include an integrated circuit device embodying one or more of the inventive concepts disclosed herein.

The method of forming an integrated circuit device generally includes the steps of (a) aligning at least one of a plurality of exposed terminals on a first semiconductor die with at least one of a plurality of exposed terminals on a second semiconductor die, and (b) forming at least one electrical junction between the exposed terminal of the first die and the exposed terminal of the second die, such that the exposed terminal(s) on the first die are in electrical communication with an I/O circuit in the second die and with an I/O terminal on the second die.

The method of protecting a first semiconductor die in an integrated circuit device generally includes the steps (a) applying a signal to an I/O terminal on a second semiconductor die, (b) communicating said signal to a protective device on said second die, and (c) communicating said signal to at least one of said plurality of exposed terminals.

The apparatus for testing a semiconductor die may comprise (a) one or more probe tips configured to contact an exposed terminal on a surface of the semiconductor die, (b) an ESD protection structure in electrical communication with at least one probe tip, and (c) an electrical signal conduit in electrical communication with the ESD protection structure and the probe tip.

The present invention advantageously provides the ability to fabricate the second die using different (e.g., larger line width and/or less expensive) manufacturing processes than those used to fabricate the first die. Thus, I/O circuits (e.g., protective structures, such as electrostatic discharge protection devices, I/O buffer and/or driver circuits, passive components such as resistors, capacitors, inductors, etc., even certain functional circuits or circuit blocks such as voltage regulators and charge pumps) and/or I/O terminals (e.g., bond pads, bump pads, balls of ball grid arrays, etc.) whose size may not change significantly with more advanced process technologies can be fabricated separately from circuits in the first die. Accordingly, space on the first die is not consumed by structures which do not substantially benefit from smaller (and/or more expensive) process technology. Thus, the first die may be optimized for the desired functional application(s), while the second die may be optimized for the protective and/or other structures.

These and other advantages of the present invention will become readily apparent from the detailed description of preferred embodiments below.

DETAILED DESCRIPTION OF THE PREFERRED EMBODIMENTS

Figure 1:
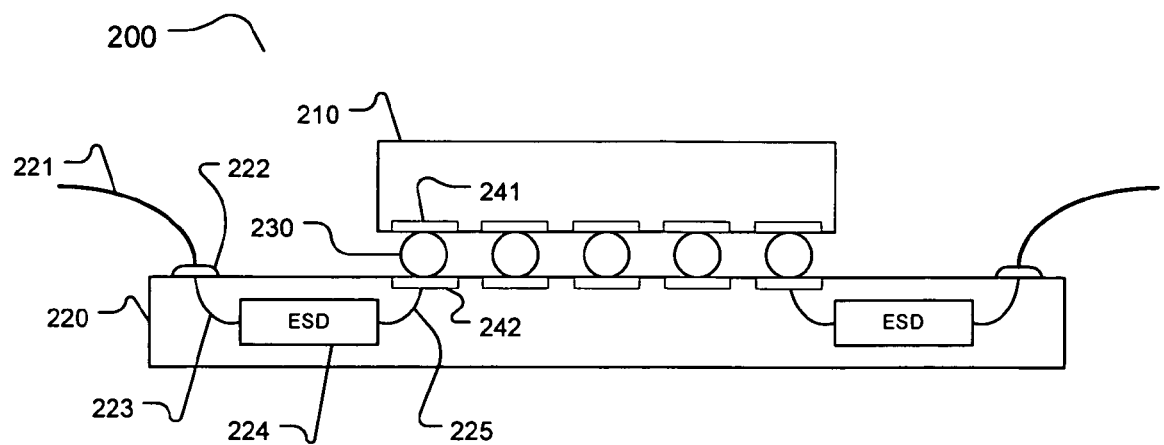
FIG. 1 is a diagram showing a side view of a two-die integrated circuit device according to the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams, or waveforms within a computer, processor, controller, and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The present invention concerns an integrated circuit device, systems incorporating the integrated circuit device, and methods for forming, using and testing the integrated circuit device. The integrated circuit device generally comprises two semiconductor dies. The first die generally includes active circuit components (e.g., transistors, switches, functional circuit blocks, etc.) and a first plurality of exposed terminals (e.g., bump pads, ball bonds, or ball bond pads). The first die may implement, for example, application specific integrated circuits [ASICs], microprocessors, system-on-chip [SOC] architectures, etc. The first die also generally has little or no I/O protection or ESD protection structures or circuits thereon. The second die generally includes (i) a second plurality of exposed terminals, wherein at least one of the second plurality of terminals is in electrical communication with one or more of the first plurality of terminals, (ii) a plurality of input and/or output (I/O) circuits, wherein at least one of the I/O circuits is in electrical communication with one or more of the second plurality of terminals, and (iii) a plurality of I/O terminals, wherein at least one of the I/O terminals is in electrical communication with one or more of the I/O circuits. The second die is generally fabricated using a relatively less advanced (e.g., larger line width and/or less expensive) manufacturing process than that used to fabricate the first die. Thus, circuits such as electrostatic discharge protection devices, I/O buffer and/or driver circuits, resistors, capacitors, inductors, voltage regulators and charge pumps, the size of which generally does not scale down across process technologies in the same proportion as transistors and/or certain metal lines (e.g., "first level" metallization), can be fabricated separately from electrically functional and/or operational circuits in the first die that have dimensions and components that benefit more from advanced technologies.

The systems generally comprise those that include an integrated circuit device embodying one or more of the inventive concepts disclosed herein.

The method of forming an integrated circuit device generally includes the steps of (a) aligning at least one of a plurality of exposed terminals on a first semiconductor die with at least one of a plurality of exposed terminals on a second semiconductor die, and (b) forming at least one electrical junction between the exposed terminal of the first die and the exposed terminal of the second die, such that the exposed terminals on the first die is in electrical communication with an I/O circuit in the second die and with an I/O terminal on the second die.

The invention, in its various aspects, will be explained in greater detail below with regard to exemplary embodiments.

An Exemplary Integrated Circuit Device

In one aspect, the present invention relates to an integrated circuit device comprising two semiconductor dies. The first die generally includes a first plurality of exposed terminals. The second die generally includes (i) a second plurality of exposed terminals, wherein at least one of the second plurality of terminals is in electrical communication with one or more of the first plurality of terminals, (ii) a plurality of input and/or output (I/O) circuits, wherein at least one of the I/O circuits is in electrical communication with one or more of the second plurality of terminals, and (iii) a plurality of I/O terminals, wherein at least one of the I/O terminals is in electrical communication with one or more of the I/O circuits. Alternatively, the first die may comprise means for receiving filtered signals. The second die may comprise means for receiving I/O signal(s), means for filtering the I/O signal(s), and means for transmitting the filtered I/O signal to the means for receiving filtered signals on the first die.

Some or all of the exposed terminals on the first die may be in electrical communication with the exposed terminals on the second die. Furthermore, some or all of the exposed terminals on the second die may be in electrical communication with I/O circuits (e.g., I/O buffers or filters and/or ESD protective devices) and/or I/O terminals. In one embodiment of the invention, at least one of the plurality of I/O circuits may comprise a protective device. Thus, the I/O circuits may comprise a means for protecting the IC device. In a further embodiment, the protective device may comprise an ESD protection structure. The ESD protection structure may comprise passive protection components (e.g., one or more diodes and/or resistors) and/or active protection components (e.g., a lateral NPN transistor). ESD protection devices generally provide a low-energy conductance path for overvoltages that are inadvertently applied to input terminals to be safely carried to a ground potential, away from the overvoltage-sensitive transistors and other circuitry that may make up the integrated circuit. The operation, structure, and design of conventional overvoltage protection devices are also quite well-known. Thus, the means for protecting the IC device may comprise means for protecting the device from electrostatic discharge.

Figure 2:
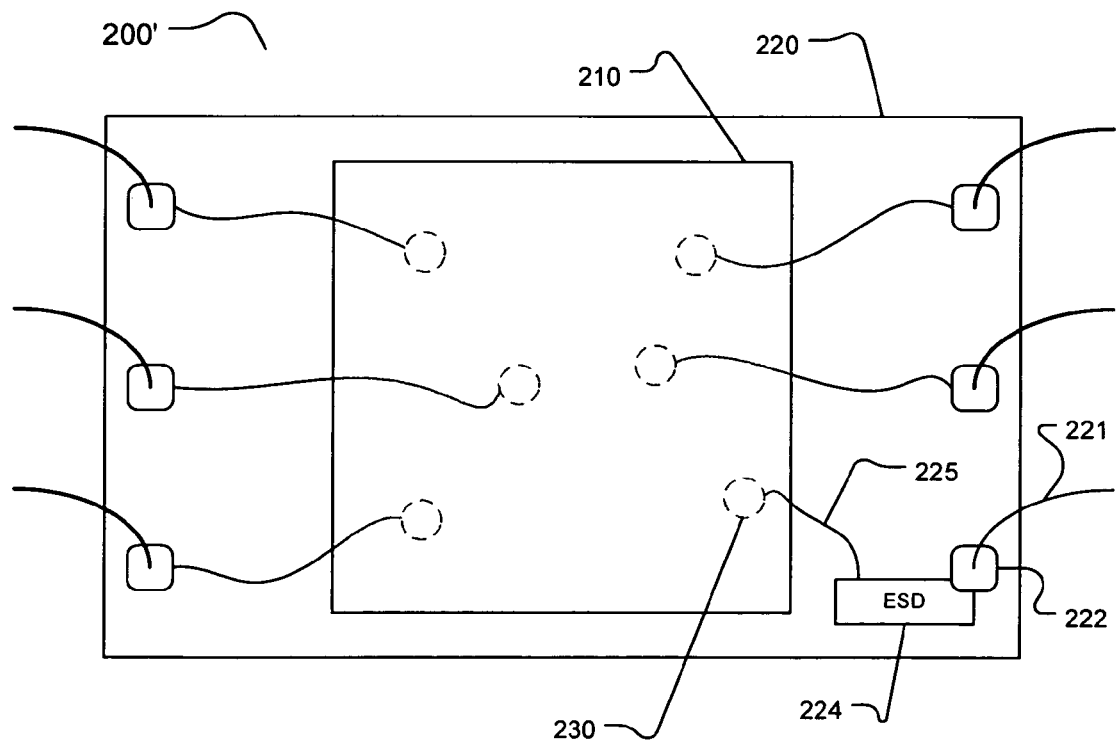
FIG. 2 is a diagram showing a top-down view of a two-die integrated circuit device according to the present invention.

FIGS. 1 and 2 show side and top views, respectively, of exemplary integrated circuit devices 200 and 200'. Both devices generally including a first semiconductor die 210 and a second semiconductor die 220. Second semiconductor die 220 may, for example, be a packaging substrate with a larger area than die 210. Semiconductor dies 210 and 220 generally include terminals for electrical interconnections (e.g., bond pads 241 and 242), with electrical interconnections formed between the dies through those terminals (e.g., through metal bumps or metal ball 230). In a preferred embodiment, semiconductor die 210 has no input/output protection structures (e.g., ESD protection structures), or may have some limited protection structures. The second die 220 may include ESD protection structure 224 in electrical communication (e.g., through connections 223 and 225) with terminal 242 (and thereby in electrical communication with terminal 241 on first die 210 through ball bond 230). The ESD protection structure is also generally in communication with I/O terminal 222 (e.g., a bond pad connected to I/O wire 221 by ball bonding or wedge bonding).

The size of an ESD protection structure is often independent of process size (or at least less dependent on process size than other structures). Thus, it is advantageous for semiconductor die 210 may be manufactured according to a relatively small manufacturing process (e.g., a copper-based process, or another semiconductor manufacturing process with 0.13 μm, 90 nm, 65 nm, or smaller design rules), while these relatively larger structures may be formed more efficiently and/or more economically on semiconductor die 220, which may be manufactured according to a relatively larger manufacturing process (e.g., an aluminum-based process, or another semiconductor manufacturing process with 0.18 μm, 0.25 μm, or larger design rules). Thus, the first die may have a critical dimension (i.e., minimum feature size as defined by the design rules of the applicable process technology) that is not greater than a first value, and the second die may have a critical dimension not less than a second value, where the first value is less than the second value. For example, where the critical dimension of the first die is 0.13 μm, the critical dimension of the second die is greater than 0.13 μm (e.g., 0.15 μm, 0.18 μm, etc.).

Those skilled in the art will recognize that the size of many semiconductor structures may be independent or less dependant on process size. Thus, the I/O circuits on the second die may also include one or more passive components (e.g., a resistor, capacitor, inductor, or combination thereof, such as an RC filter), a voltage regulator, charge pump and/or one or more I/O buffer or driver circuits. Therefore, the I/O circuits may comprise means for regulating voltage and/or means for driving I/O signals. Other components that may be more efficiently or less expensively formed on the second die may include capacitors, resistors, and/or inductors.

In another embodiment, the first die may comprise features with a minimum feature size of 0.13 μm or less (e.g., the first die is manufactured according to a 0.13 μm or smaller process), and the second die may comprise features with a minimum feature size of 0.18 μm or more (e.g., the second die may be manufactured according to a 0.18 μm or larger process). Thus, the under typical manufacturing processes, the first die may generally use metal lines comprising copper, while the second die may generally use metal lines comprising aluminum.

In another embodiment, the first plurality of exposed terminals may be on a first surface of the first die (e.g., terminal 241 on the lower surface of first die 210 in FIG. 1), and the second plurality of exposed terminals may be on a first surface of the second die (e.g., terminal 242 on the upper surface of second die 220). The first surface of the first die and the second surface of the second die may generally face each other. Thus, the exposed terminals of the first and second die may be aligned and bonded to each other.

In a further embodiment, the exposed terminals of the first and second die may comprise bump pads, with metal bumps formed on one or both sets of bump pads. Thus, the dies may be flip-chip bonded to each other (e.g., by a controlled collapse chip connect [C4] process). The metal bumps may comprise gold, solder, or any other material suitable for flip-chip type bonding.

The first and second dies may be designed to have corresponding pluralities of exposed terminals that are aligned with each other in a one-to-one relationship. However, in some cases, the second die may have extra (unused) terminals. In other words, a subset of the exposed terminals on the second day may not be matched to or aligned with a corresponding terminal on the first device. In a preferred embodiment, the terminals may be arranged in a regular pattern. For example, the terminals may be arranged in an x-by-y array of terminals on each die, where x and y are, independently, integers of at least 4, 6, 8, 10, or 12, etc. In some cases, a subset of locations in the array may not have a corresponding terminal on one or both of the die. For example, one or both dies may have no terminals at points corresponding to the corners of the array (e.g., due to relatively high stress at the corners of the first die). Furthermore, the array of terminals on one or both dies may have one or more gaps or open spaces in the middle of the array (e.g., a region within the array without any corresponding terminals). The gap may have a regular shape, such as a rectangle corresponding to an x'-by-y' array, where x' and y' may be, independently, integers of at least 2, 4, 6, or more, such that (x-x') and (y-y') are each an integer of 2, 4, 6, or more. Thus, the terminals on one or both dies may form a perimeter around the edges of the die that is 1, 2, 3, or more terminals deep.

In one exemplary embodiment, the second die may be designed and manufactured without reference to the design of the first die. Thus, the second die may comprise an ordered array of exposed terminals for interconnection with a first die, and may have a "standard" set of I/O terminals, I/O circuits, and/or ESD protection structures. Therefore, the "standard" protective (second) die may be optimized for protective functions and/or manufactured in relatively large quantity. The first die may be designed and manufactured for a specific purpose, with terminals configured to align with desired functionality and/or connectivity on the "standard" protective die.

Figure 3:
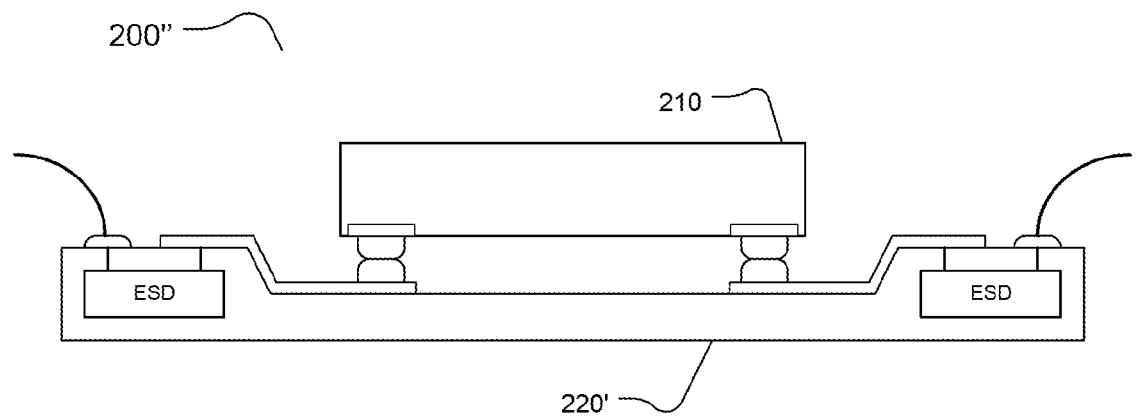
FIG. 3 is a diagram showing a side view of an alternative embodiment of a two-die integrated circuit device according to the present invention.

Referring now to FIG. 3, integrated circuit device 200" may include first die 210 and second die 220', generally corresponding to first die 210 and second die 220 of FIGS. 1 and 2. However, second die 220' may be formed with a recessed region in which first die 210 may fit. Thus, the total height of integrated circuit device 200" may be reduced relative integrated circuit devices 200 and 200'.

Figure 4:
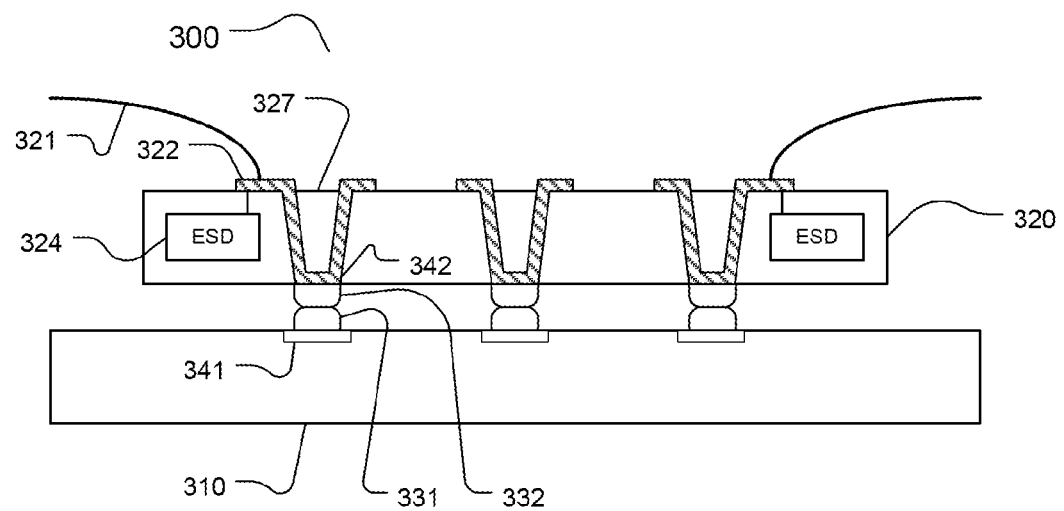
FIG. 4 is a diagram showing a side view of another alternative embodiment of a two-die integrated circuit device according to the present invention.

Referring now to FIG. 4, integrated circuit device 300 may include first semiconductor die 310 and second semiconductor die 320. Semiconductor dies 310 and 320 generally include terminals for electrical interconnections (e.g., bump pads 341 and 342), with electrical interconnections formed between the dies through those terminals (e.g., through metal bumps 331 and 332). In a preferred embodiment, semiconductor die 310 has no input/output protection structures (e.g., ESD protection structures), or may have some limited protection structures. The second die 320 may include ESD protection structure 324 in electrical communication with terminal 342 on second die 320 (and thereby in electrical communication with terminal 341 on first die 310 through metal bumps 331 and 332). The ESD protection structure may comprise passive and/or active protection components (e.g., lateral NPN transistors). The ESD protection structure is also generally in communication with I/O terminal 322 (e.g., a bond pad connected to I/O wire 321 by ball bonding or wedge bonding). In this case, the I/O terminals are on a surface on the opposite side of second die 320 from the surface facing first die 310. Second die 320 may include via hole 327, through which I/O terminal 322 is in electrical communication with terminal 341 on first die 310 through metal bumps 331 and 332.

Figure 7A:
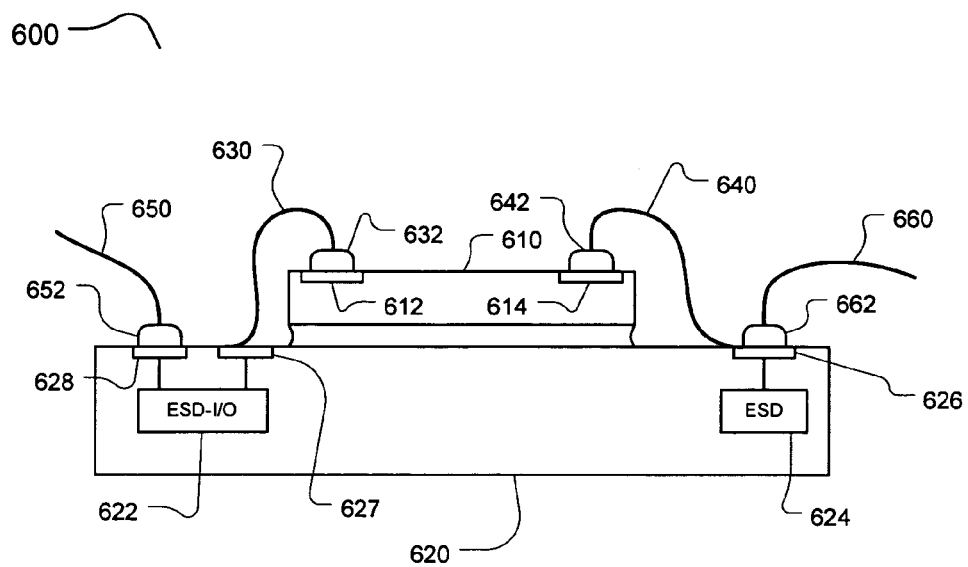
FIGS. 7A-7B are diagrams respectively showing a side view and a top-down view of an alternative two-die integrated circuit device according to the present invention.

The present invention is also applicable to wire-bonded dies. FIG. 7A shows a cross-section of a stacked-die integrated circuit 600, comprising first die 610, second die 620, and a plurality of wire bonds 630, 640, 650 and 660 bonded thereto. First die 610 includes bond pads 612 and 614, having wire bonds 630 and 640 ball-bonded thereto via balls 632 and 642, respectively. The other ends of wire bonds 630 and 640 are stitch-bonded to bond pads 627 and 626 on second die 620, respectively. Of course, one may reverse the ball and stitch ends of wire bonds 630 and 640. Second die 620 further includes ESD-I/O circuit 622, ESD circuit 624, and bond pad 628.

Generally, signals pass through ESD-I/O circuit 622, but merely communicate with ESD circuit 624. In one implementation, ESD-I/O circuit 622 includes both a protective circuit (such as an ESD circuit) and an I/O circuit (such as a buffer). Optionally, ESD-I/O circuit 622 further includes one or more passive components, such as a resistor and/or a capacitor. In one implementation, a signal that is advantageously buffered, such as data, clock, status and control signals, are passed through ESD-I/O circuit 622, as an input and/or output signal. For example, an external input signal received on wire bond 650 passes through an input buffer in electrical communication with an ESD circuit (both of which are in ESD-I/O circuit 622), and the input buffer transmits the buffered signal to an exposed terminal (bond pad) 612 on the first die 610 via wire bond 630. An output signal from the first die 610 may be transmitted to an exposed terminal (bond pad) 627 on the second die 620 via wire bond 630, and an output driver in ESD-I/O circuit 622 may buffer and/or drive the output signal to an external source via wire bond 650. Naturally, the ball end 652 of wire bond 650 may be located on an external signal transmission medium, such as a lead frame.

However, ESD circuit 624 generally includes a protective device (e.g., an ESD device, such as an NPN bipolar transistor) and optionally one or more passive components, such as a resistor and/or a capacitor. In one implementation, a pin (or I/O terminal) in electrical communication with ESD circuit 624 is assigned to a power supply (e.g., Vcc or ground), a reference voltage or certain reference signals (such as a reference clock) that may not require an active component or device. For example, a power supply on pin (wire bond) 660 is in electrical communication with both ESD circuit 624 (via I/O terminal [bond pad] 626) and the first die 610 (via exposed terminal [bond pad] 614 and wire bond 640). While the arrangement of wire bonds 640 and 660 on bond pad 626 shows the ball end 662 of wire bond 660 on the stitch end of wire bond 640, alternative arrangements are possible. For example, the ball end of wire bond 640 may be on the stitch end of wire bond 660; wire bond 640 (or wire bond 630) may be stitched to a free-standing ball (not shown); etc.

Figure 7B:
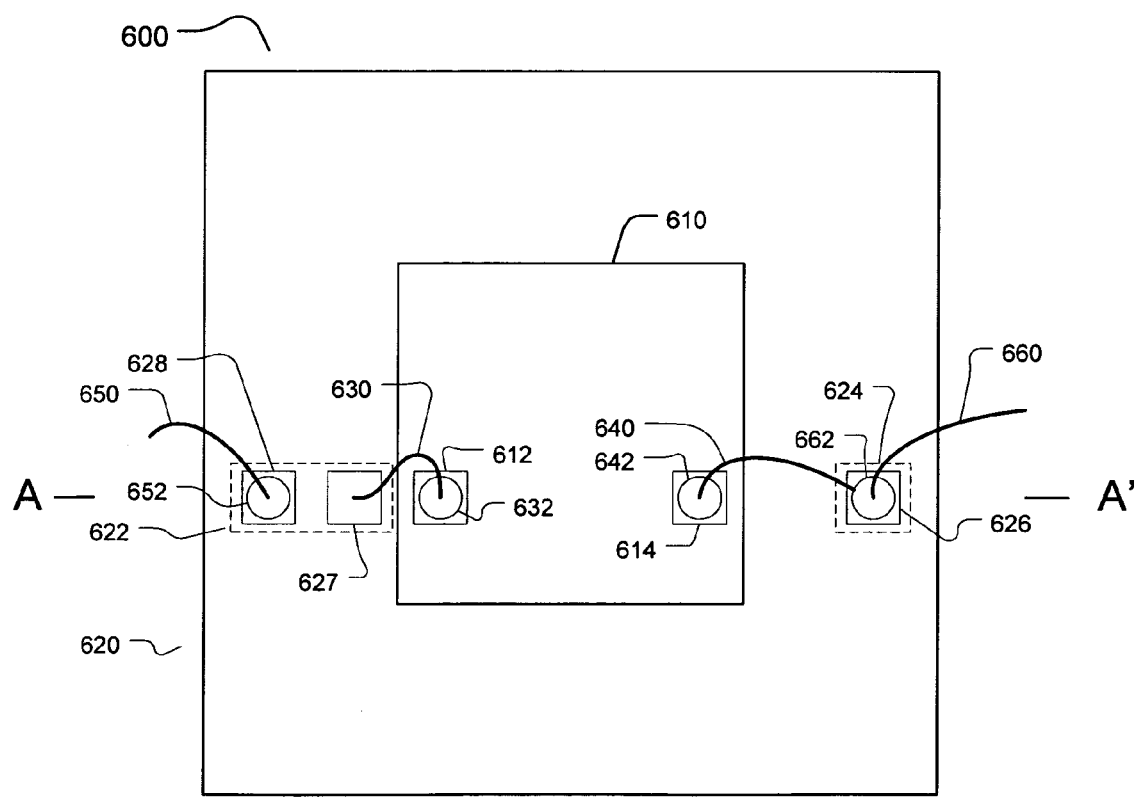

FIG. 7B shows a top down view of integrated circuit 600. As shown therein, FIG. 7A is a cross-section of the integrated circuit 600 along plane A-A'. FIG. 7B shows a further alternative, which may be advantageous when the second die 620 has substantially greater area for bond pads than does first die 610. In the alternative arrangement, bond pads 672 and 674 are side-by-side, along an axis parallel with the edges of first and second dies 610 and 620. One of the bond pads (in this case, "I/O terminal" bond pad 672) communicates externally, and the other bond pad (in this case, "exposed terminal" bond pad 674) communicates with the first die 610. Such an arrangement may reduce or minimize the additional real estate of the second die 620, relative to that of the first die 610.

Exemplary Systems and Networks

In a further aspect of the invention, a transceiver may comprise (a) the integrated circuit device described herein, (b) a transmitter communicatively coupled to at least one of the I/O terminals of the integrated circuit device (e.g., to I/O terminal 222 of FIG. 1), where the transmitter is configured to transmit serial data to a network, (c) a receiver communicatively coupled to at least one of the I/O terminals, configured to receive serial data from the network, and (d) a phase locked loop (PLL) configured to provide a reference clock signal to the transmitter and the receiver. In one implementation, the PLL is on the first die.

Thus, a system for transferring data on or across a network may comprise (a) the above transceiver, (b) at least one transmitter port communicatively coupled to the transmitter for transmitting serial data to an external receiver, and (c) at least one receiver port communicatively coupled to the receiver for receiving the data stream. Furthermore, a network according to the present invention may comprise a plurality of the systems, communicatively coupled to each other, and a plurality of storage or communications devices, where each of the storage or communications devices is communicatively coupled to one of the systems.

In another embodiment, the first die of the present integrated circuit device (e.g., first die 210 of FIG. 1) may have one or more components of a transceiver circuit formed therein. The second die of the integrated circuit device (e.g., second die 220) may have other components of a transceiver circuit formed therein, such as I/O conditioning (e.g., filtering) circuits, I/O driving circuits, and/or reference clock generators. The transceiver circuit may comprise (a) a transmitter circuit configured to transmit data to a network though the I/O terminals on the second die, a receiver circuit configured to receive network data through one or more of the I/O terminals, and a reference clock configured to provide a reference clock signal to the transmitter and receiver circuits. Thus, the transceiver circuit may comprise (a) means for transmitting data to a network through at least one of the first plurality of exposed terminals, (b) means for receiving a serial data stream from the network through at least one of the first plurality of exposed terminals, and (c) means for providing a reference clock signal to the means for transmitting and the means for receiving.

A system for transferring data on or across a network may comprise (a) the above integrated circuit device (e.g., the integrated circuit device of the present invention with a transceiver circuit formed on the first die), (b) a first port communicatively coupled to a first I/O pad, where the first I/O pad in electrical communication with the means for transmitting, and (c) a second port communicatively coupled to a second I/O pad, the second I/O pad in electrical communication with the means for receiving.

A network may comprise a plurality of the above systems (e.g., the system with an integrated circuit device of the present invention with a transceiver circuit formed on the first die) and a plurality of means for storing or further communicating data from the serial data stream. Each of the means for storing or further communicating may be communicatively coupled to one of the systems.

Exemplary Methods of Forming Integrated Circuit Devices

The present invention further relates to a method of forming an integrated circuit device. The method generally includes the steps of (a) forming a first semiconductor die, including the step of forming a first plurality of exposed terminals in the first die, (b) forming a second semiconductor die, including the steps of (i) forming a second plurality of exposed terminals in the second die, (ii) forming a plurality of input and/or output (I/O) circuits in the second die, wherein at least one of the I/O circuits is in electrical communication with one or more of the second plurality of terminals, and (iii) forming a plurality of input and/or output (I/O) terminals in the second die, wherein at least one of the I/O terminals is in electrical communication with one or more of the I/O circuits, (c) aligning at least one of the second plurality of terminals with at least one of the first plurality of terminals, and (d) forming one or more electrical junctions between the second plurality of terminals and the first plurality of terminals.

The method of forming an integrated circuit device generally includes the steps of (a) aligning at least one of a plurality of exposed terminals on a first semiconductor die with at least one of a plurality of exposed terminals on a second semiconductor die, and (b) forming at least one electrical junction between the exposed terminal of the first die and the exposed terminal of the second die, such that the exposed terminals on the first die is in electrical communication with an I/O circuit in the second die and with an I/O terminal on the second die. In one exemplary embodiment, the first die may have a minimum feature size of 0.13 µm or less and/or comprise copper metallization, and the second die may have a minimum feature width of 0.18 µm or greater and/or comprise aluminum metallization.

In a further embodiment, the method includes the step of forming the first semiconductor die, including the step of forming the first plurality of exposed terminals in the first die. In another embodiment, the method includes the step of forming the second semiconductor die, including the steps of (a) forming the second plurality of exposed terminals in the second die, (b) forming a plurality of input and/or output (I/O) circuits in the second die, wherein at least one of the I/O circuits is in electrical communication with one or more of the second plurality of terminals, and (c) forming a plurality of input and/or output (I/O) terminals in the second die, wherein at least one of the I/O terminals is in electrical communication with one or more of the I/O circuits.

In a further embodiment, the step of forming the I/O circuits may comprise a step of forming at least one protective device, such as an electrostatic discharge (ESD) protection structure. Those skilled in the art will recognize that, as with ESD structures, the size of many semiconductor structures may be independent or less dependant on process size. Thus, the method may also include forming voltage regulators, I/O driver circuits, capacitors, and/or inductors on the second die.

In another embodiment, the method may include the steps of forming the first plurality of terminals on a first surface of the first die and forming the second plurality of terminals on a first surface of the second die. Thus, the dies may be attached such that the first (terminal) surface of the first die faces the first (terminal) surface of the second die. The dies may be attached to each other using a flip-chip bonding process (e.g., a controlled collapse chip connect [C4] bonding process). Thus, the first and second plurality of terminals may comprise bond pads, and the method may further include the step of forming metal bumps on each of the bond pads on the first and/or second die. The metal bumps may comprise gold, solder, or any other material suitable for flip-chip type bonding.

In another embodiment, the method may include forming the plurality of I/O pads on the first surface of the second die (see, e.g., FIG. 1, where I/O terminal 222 is formed on the same surface as exposed terminal 242). In an alternative embodiment, the method may include forming the plurality of I/O terminals on a second surface of the second die (see, e.g., FIG. 4, where I/O terminal 322 is on an opposite side of second die 320 from bond pad 342. In a further embodiment, the method may include the steps of forming via holes between the first and second surfaces of the second die (e.g., via hole 327 of FIG. 4), and forming at least one electrical junction through at least one of the via holes between at least one of the I/O terminals and at least one of the second plurality of bump terminals.

In another embodiment, the method may include bonding at least one wire to at least one of the I/O terminals. This bonding step may comprise ball bonding, wedge bonding, or any other bonding method suitable for attaching a wire to a semiconductor die. Alternatively, the I/O terminals on the second die may be flip-chip bonded to another device (e.g., a semiconductor packaging substrate or additional semiconductor die [e.g., in a multi-chip stacked IC device]).

Those skilled in the art will recognize that a relatively large number of semiconductor dies are usually formed on a single wafer. Thus, in another embodiment, the step of forming the first die may further include the steps of (a) manufacturing a first wafer comprising a first plurality of the first semiconductor dies, and (b) sawing the first wafer to separate the first plurality of dies from the first wafer. In yet another embodiment, the step of forming the second die may further comprise (a) manufacturing a second wafer comprising a second plurality of the second semiconductor dies, and (b) sawing the first wafer to separate the second plurality of dies from the second wafer. In a further embodiment, the step of forming the first wafer may comprise manufacturing the wafer on a 0.13 μm or smaller process, and the step of forming the second wafer may comprise manufacturing the wafer on a 0.18 μm or larger process. Accordingly, the step of forming the first die may further comprise forming metal lines comprising copper, and the step of forming the second die may further comprise forming metal lines comprising aluminum.

Figure 8:
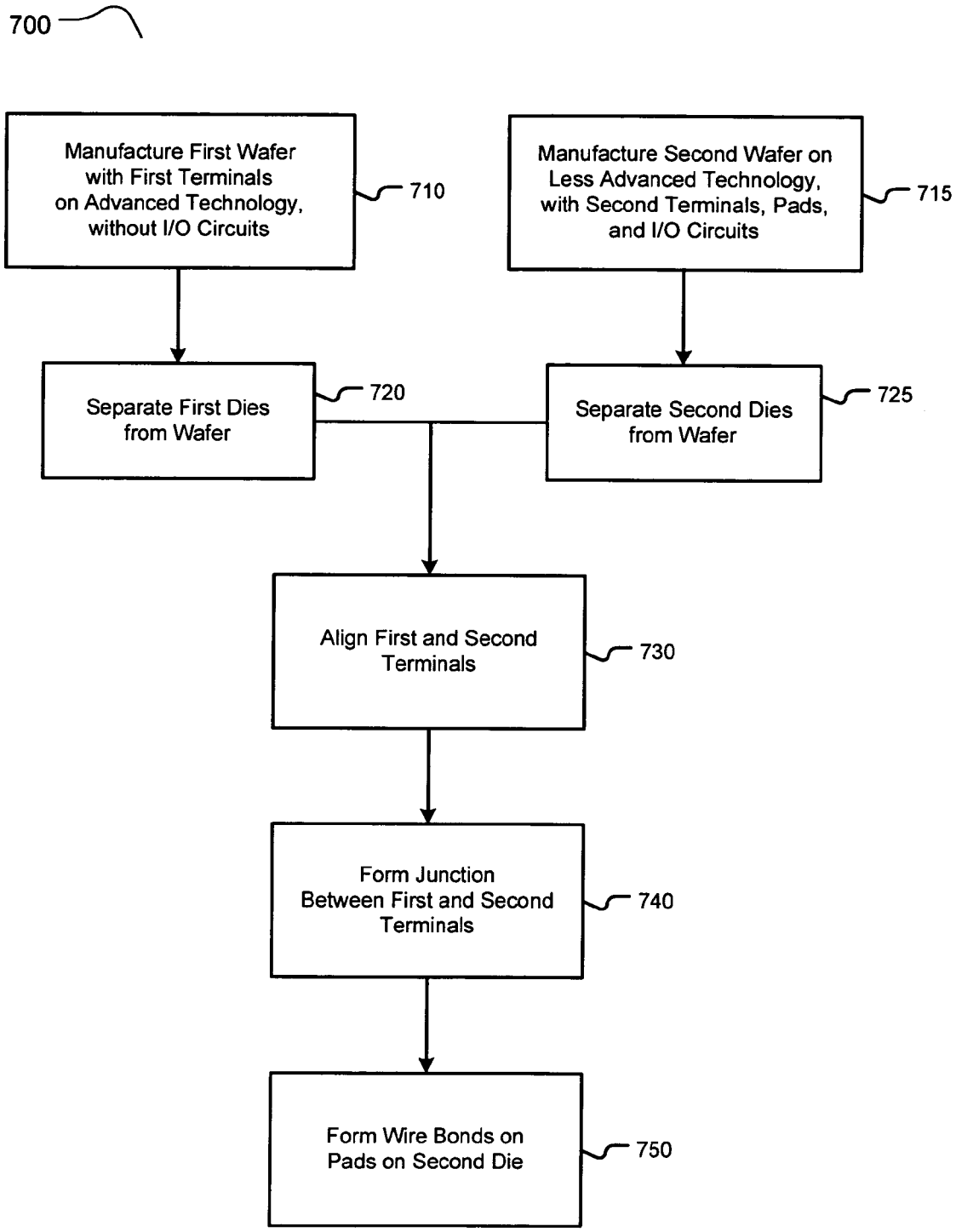
FIG. 8 is a flow diagram for an exemplary method of making a two-die integrated circuit device according to the present invention.

FIG. 8 shows a flow chart 700 for an exemplary method of making an integrated circuit in accordance with embodiments of the invention. In steps 710 and 715, wafers are manufactured, generally using different process technologies. In one process (step 710), wafers containing the first die are manufactured on a relatively advanced technology (e.g., 0.13 μm or smaller, employing copper metallization, etc.), and the first die do not contain I/O circuits. In the other process (step 715), wafers containing the first die are manufactured on a relatively less advanced technology (e.g., 0.18 μm or larger, employing aluminum metallization, etc.), and the first die contains I/O circuits (e.g., ESD circuits, buffers, passive components) and bond pads. The second die may also have bond pads (see, e.g., the example of FIGS. 7A-7B), but in some embodiments (e.g., FIG. 3), the second die does not have bond pads. Advantageously, the time periods during which the different wafers are manufactured overlap at least partly.

After the wafers are manufactured, the dies are separated (e.g., by sawing). The first dies manufactured using advanced technology are separated in step 720, and the second dies manufactured using less advanced technology are separated in step 725. The dies and/or wafers may be tested either before or after separating the dies.

Thereafter, two-die integrated circuits are formed. First, in step 730, first exposed terminals on the first die are aligned with second exposed terminals on the second die (or vice versa). Next, the first and second terminals are bonded to each other (e.g., by conventional ball bonding or flip-chip bonding) in step 740. Finally, in step 750, wire bonds are made to the bond pads (I/O terminals) on the second die. Following wire bonding, the stacked integrated circuit may be conventionally packaged.

Alternatively, where the first and second exposed terminals on the first and second die comprise bond pads, the first die may be aligned with the second die at one or more predetermined locations, then conventionally stacked onto the second die (e.g., using an adhesive), optionally with one or more additional (passive) components therebetween (e.g., an antenna, a heat conductor, etc.). Thereafter, wire bonds are made between the terminals on the first and second die, and between the I/O terminals on the second die and an external signal transmission element (e.g., a lead frame in electrical communication with a lead or pin). Following wire bonding, the integrated circuit may be conventionally packaged.

Exemplary Methods of Protecting Integrated Circuit Devices

The present invention also relates to a method of protecting a first semiconductor die in an integrated circuit device. The first die generally comprises a first plurality of exposed terminals, and generally has little or no I/O protection circuitry (e.g., ESD protection structures). The method of protecting generally includes the steps (a) applying a signal to an I/O terminal on a second semiconductor die, (b) communicating the signal to a protective device on the second die, and (c) communicating the signal to at least one of the plurality of exposed terminals on the first die. In a preferred embodiment, the protective device may comprise an electrostatic discharge (ESD) protection structure.

In another embodiment, the I/O terminal may comprise a bond pad, and the method of the method of protecting may further include the step of transmitting the signal from an I/O wire to the bond pad. The I/O wire may generally be bonded to the bond pad (e.g., by ball bonding or wedge bonding). It will be recognized that the first die will generally include a relatively large number of exposed terminals (e.g., an array of bump pads), and that the second die will generally have a relatively large number of I/O terminals an I/O wires bonded thereto. Thus, the second die may receive a plurality of signals, which may be applied to a corresponding plurality of protective structures and then transmitted to the terminals of the first die.

Figure 9:
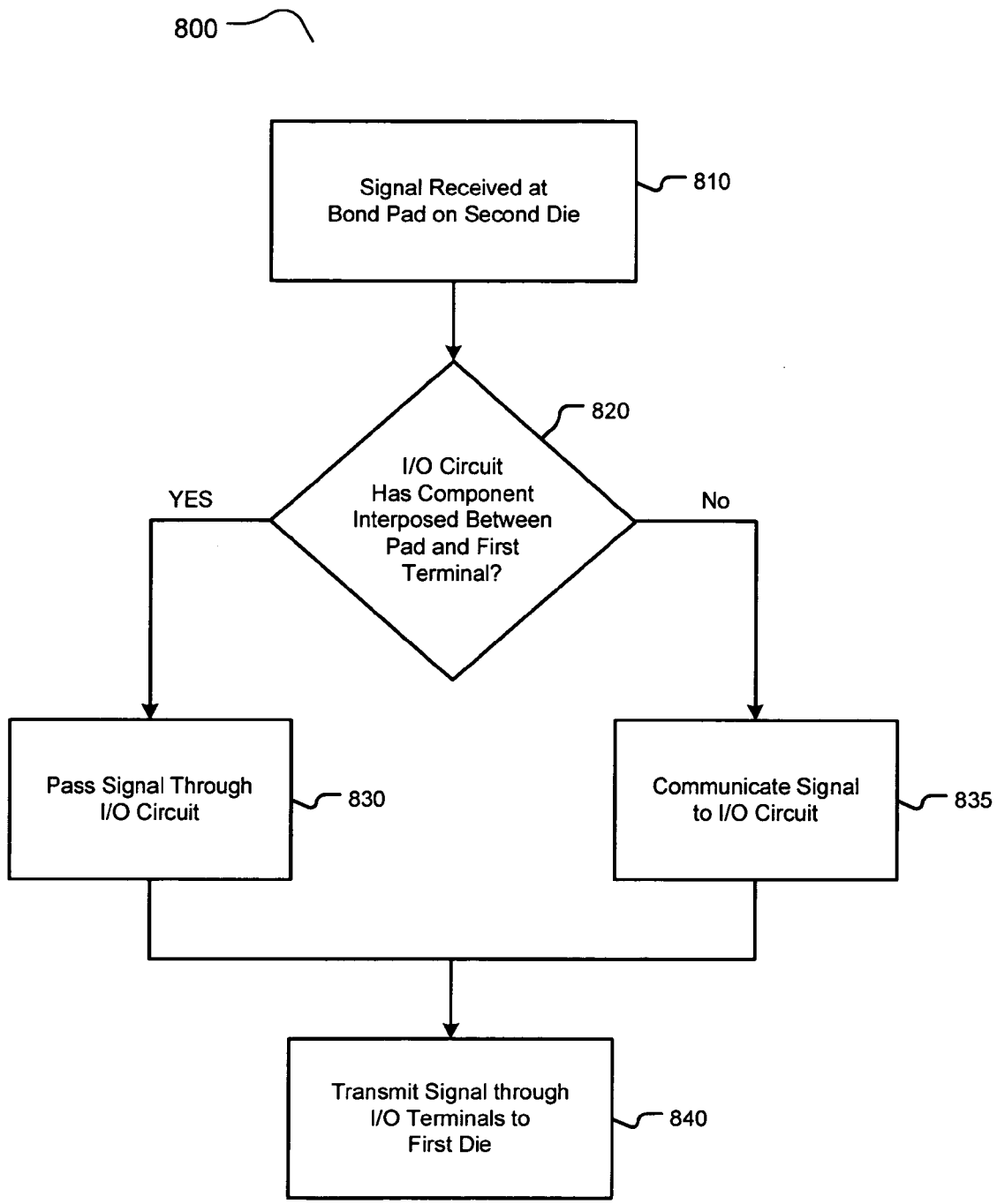
FIG. 9 is a flow diagram for an exemplary method of protecting a die in an integrated circuit device according to the present invention.

FIG. 9 shows a flow chart 800 for an exemplary method of protecting an integrated circuit in accordance with embodiments of the invention. In step 810, an external signal is received at a bond pad on the die containing the I/O circuitry (e.g., the second die). Then, depending on whether the I/O circuit has a component (e.g., a buffer, resistor, etc.) interposed between the bond pad and the I/O terminal on the second die, determined at step 820, the signal either passes through the I/O circuit (step 830) or is communicated to the I/O circuit (step 835). In either case, the signal may be communicated with an ESD circuit or device in the I/O circuitry, to protect the circuitry on the other die (e.g., the first die) from overvoltages and/or electrostatic events. When the signal is within electrical tolerances, it may be transmitted to the die containing circuits manufactured using relatively advanced technology (e.g., the first die) through the respective I/O terminals on the two die (step 840).

Exemplary Apparatus and Method for Testing

The present invention further relates to an apparatus for testing a semiconductor die (e.g., semiconductor die 360 in FIG. 5), wherein the semiconductor die has minimal protection from electrostatic discharge. The die to be tested generally corresponds to first die 210 of FIGS. 1, 2, and/or 3. This die may advantageously have little or no ESD or other protective structures, because these structures may be located on second die 220 or 220'. However, during or after its manufacture and before being attached to the second die, the first die must generally be tested. Application of a test probe to the die may result in an electrostatic discharge, so a test probe for a semiconductor die with little or no ESD protection should preferably have its own ESD protection. Thus, the present apparatus may comprise (a) one or more probe tips configured to contact an exposed terminal on a surface of the semiconductor die, (b) an ESD protection structure in electrical communication with at least one probe tip, and (c) an electrical signal conduit in electrical communication with the ESD protection structure and the probe tip. In a preferred embodiment, the die to be tested may use metal lines comprising copper.

In another embodiment, the exposed terminals of the die may be on a first surface of the die, the probe tip may be on a first surface of a probe head, and the first surface of the die may face the first surface of the probe head. In a further embodiment, the I/O terminals may be on a second surface of the probe head. In yet another embodiment, the probe head may further comprise via holes between the first and second surfaces of the probe head, and the I/O terminals may be in electrical communication with the probe tip through at least one of the via holes.

It will be recognized that the semiconductor die will typically have a relatively large number of exposed terminals. Thus, in a preferred embodiment the test probe may have a corresponding plurality of probe tips, where each test probe may be in electrical communication with one or more protective devices. In one exemplary embodiment, the semiconductor die may be designed to be attached to a "standard" protective die, as described above. In that case, a test probe may be designed such that the plurality of probe tips and the associated protective devices may correspond to the arrangement of terminals and protective devices on the "standard" protective die. Such a probe may be used to test a plurality of "first die" (e.g., the semiconductor die to be tested) designs.

Figure 5:
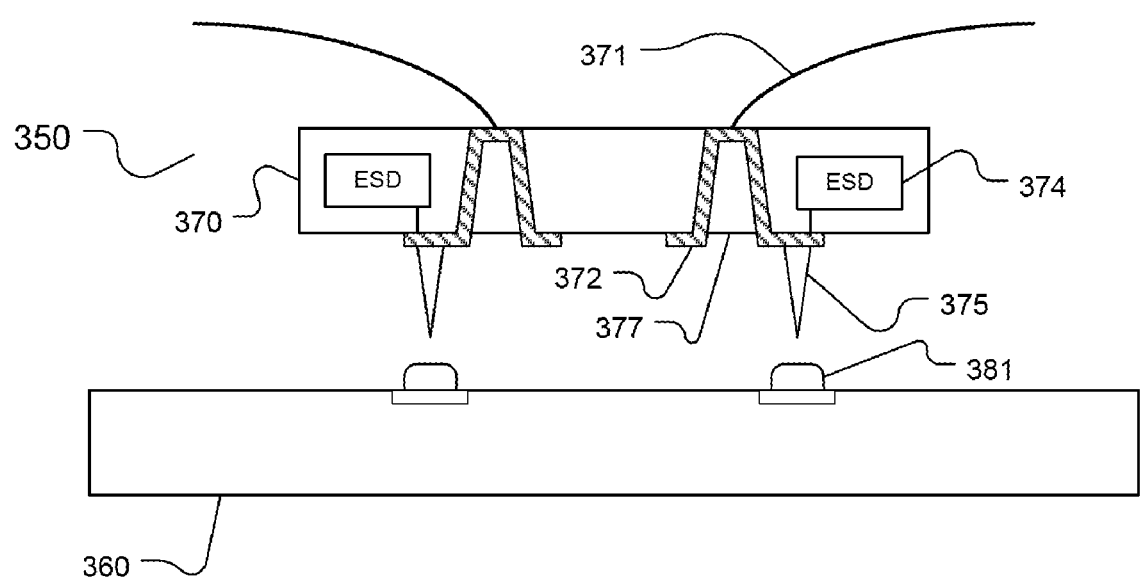
FIG. 5 a diagram showing an exemplary test apparatus for an integrated circuit device according to the present invention.

Referring now to FIG. 5, test apparatus 350 may include probe head 370. Probe head 370 may include ESD protection structure 374 in electrical communication with I/O terminal 372 and with probe tip 375 (e.g., through via hole 377). I/O wire 371 may carry I/O signals (e.g. control signals and/or data signals) to or from the probe head. ESD structure 374 generally provides ESD protection from any ESD that may result from a voltage potential difference between probe head 370 and semiconductor die 360 (e.g., through metal bump 381), or any ESD that may be transmitted on I/O wire 371. Thus, a semiconductor die 360 with little or no ESD protection may be safely tested before assembly with a second die containing ESD and/or other protection structures.

Figure 10:
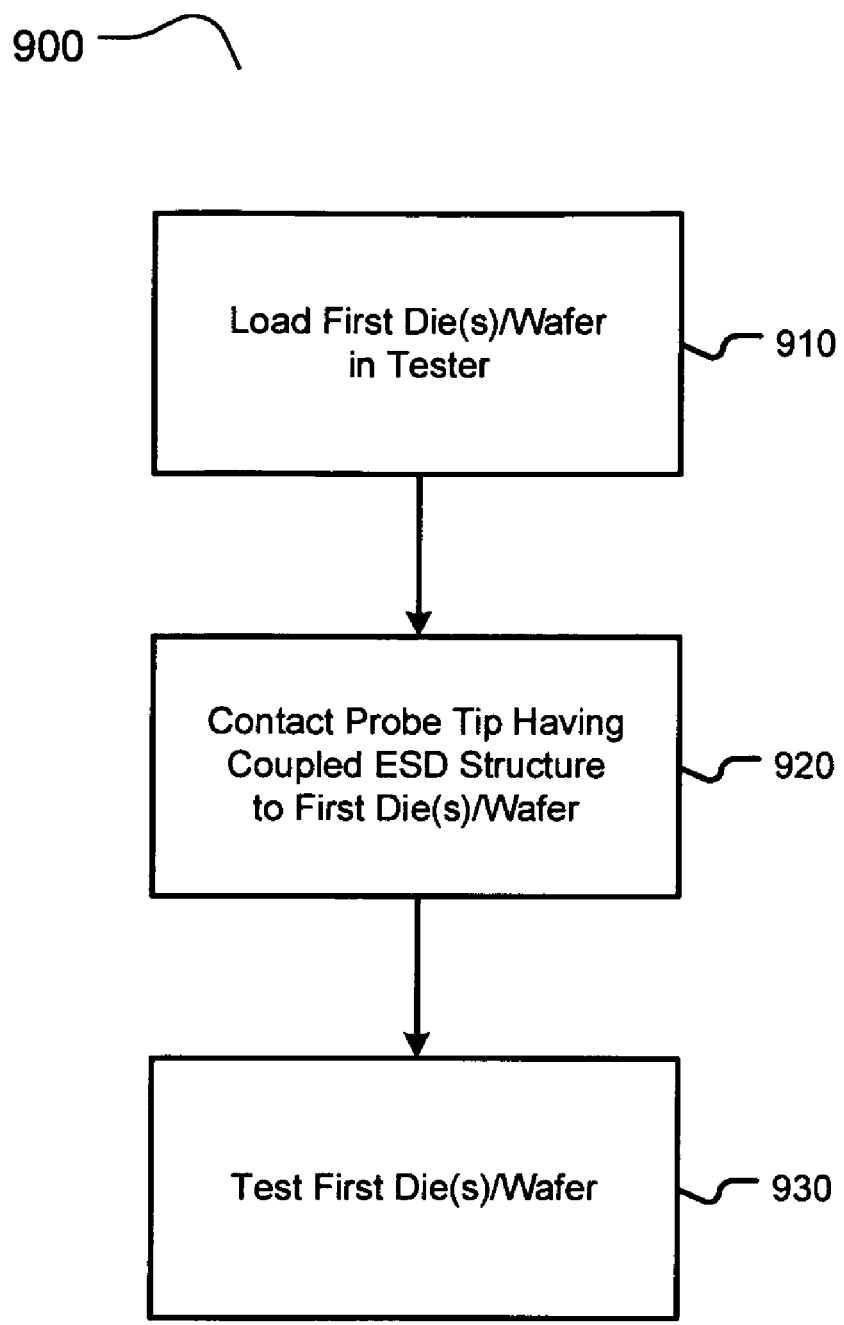
FIG. 10 is a flow diagram for an exemplary method of testing a die and/or wafer according to the present invention.

FIG. 10 shows a flow chart 900 for an exemplary method of testing an integrated circuit in accordance with embodiments of the invention. In step 910, one or more die(s) manufactured using relatively advance technology (e.g., first die) is/are loaded into the tester. Alternatively, a wafer may be placed into a predetermined position for wafer-scale testing. The tester probe tip is placed in contact with appropriate (or predetermined) I/O terminals of the first die(s), whether in singulated die form or as part of a wafer, in step 920. The probe tip has I/O circuitry (and generally, at least an ESD circuit or device) in electrical communication therewith, such as the probe tip shown in FIG. 5. When the probe tip is in contact with the I/O terminals of the die, conventional testing of the die is conducted in step 930.

Exemplary Systems Including the Integrated Circuit Device

Figure 6A:
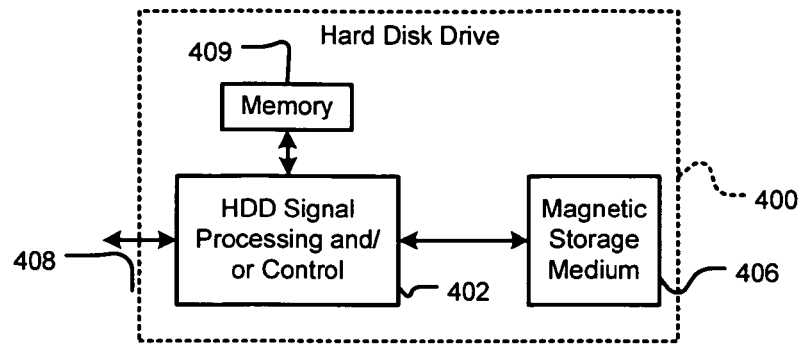
FIGS. 6A-6G show various exemplary implementations of systems including integrated circuit devices according to the present invention.

The present integrated circuit (IC) device (e.g., an IC device comprising a first semiconductor die with little or no I/O or ESD protection, attached to a second semiconductor die that includes I/O and/or ESD protection) can be implemented in various exemplary systems, as described herein. Referring now to FIG. 6A, the present invention can be implemented in a hard disk drive (HDD) 400 (or control unit therefor). The present invention may implement either or both signal processing and/or control circuits, which are generally identified in FIG. 6A at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM), and/or other suitable electronic data storage.

Figure 6B:
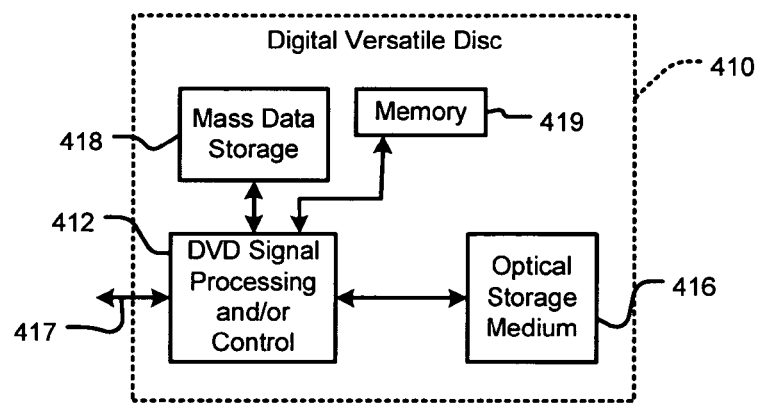

Referring now to FIG. 6B, the present invention can be implemented in an IC device for a digital versatile disc (DVD) drive 410. The present IC device may further include either or both signal processing and/or control circuits, which are generally identified in FIG. 6B at 412, and/or mass data storage of the DVD drive 410. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 6A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 6C:
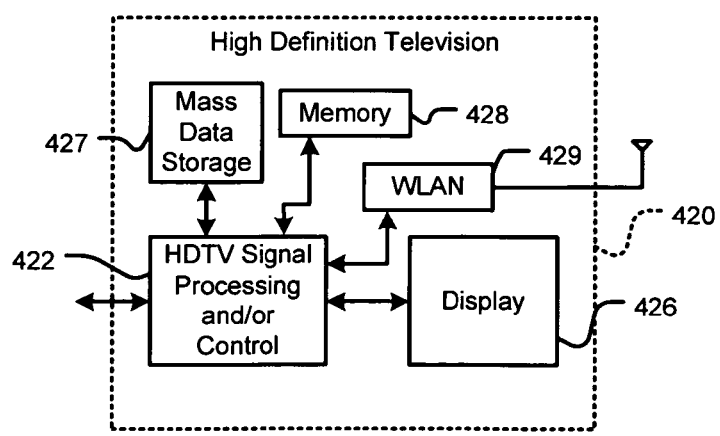

Referring now to FIG. 6C, the present invention can be implemented in an IC device for a high definition television (HDTV) 420. The present invention may implement either or both signal processing and/or control circuits, which are generally identified in FIG. 6C at 422, a WLAN interface and/or mass data storage of the HDTV 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 6A and/or at least one DVD may have the configuration shown in FIG. 6B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Figure 6D:
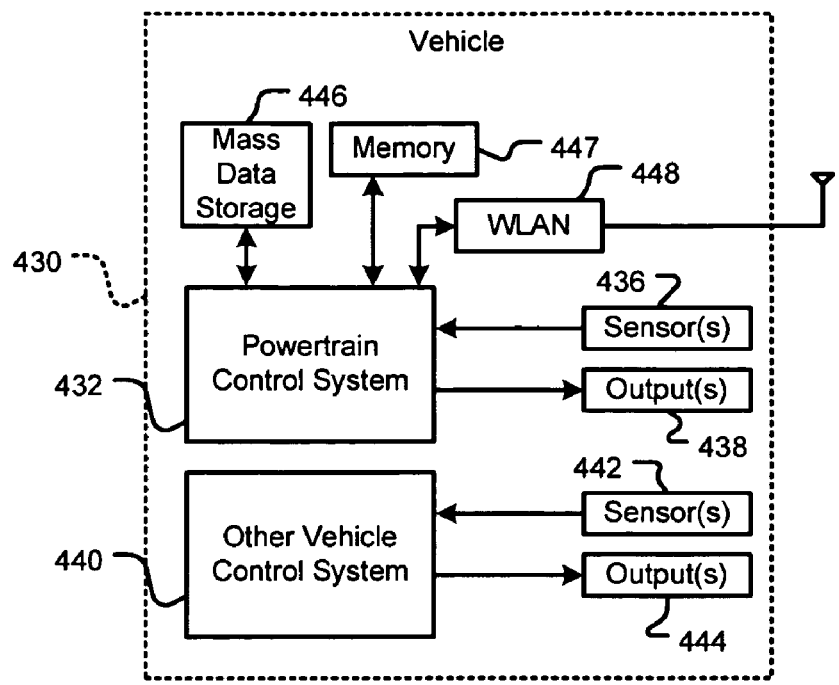

Referring now to FIG. 6D, the present invention can also be implemented in an IC device for a control system of a vehicle 430, a WLAN interface 448, and/or mass data storage of the vehicle control system 446. In some implementations, the present invention implements a powertrain control system 432 that receives inputs from one or more sensors (e.g., 436 and 442) such as temperature sensors, pressure sensors, rotational sensors, airflow sensors and/or any other suitable sensors and/or that generates one or more output control signals (e.g., 438 and 444) such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices (for example, hard disk drives [HDDs] and/or DVDs). At least one HDD may have the configuration shown in FIG. 6A and/or at least one DVD may have the configuration shown in FIG. 6B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 6E:
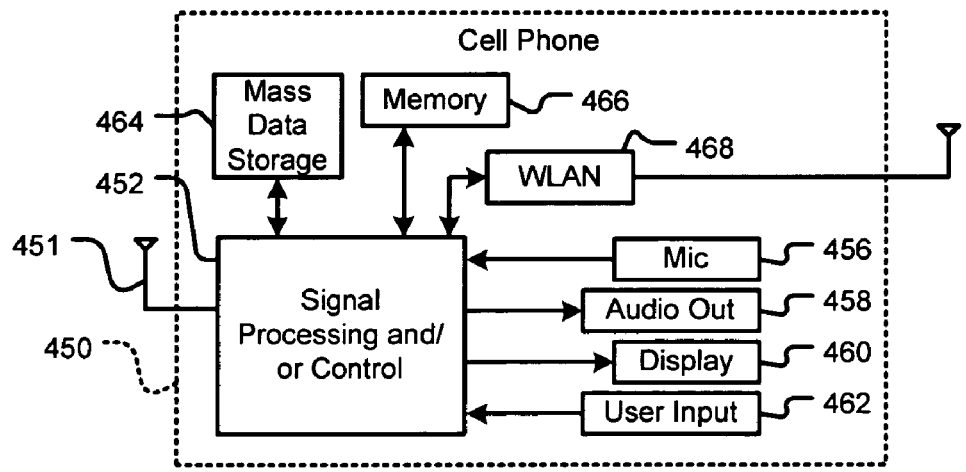

Referring now to FIG. 6E, the present invention can be implemented in an IC device for a cellular phone 450 that may include a cellular antenna 451. The present invention may implement either or both signal processing and/or control circuits, which are generally identified in FIG. 6E at 452, a WLAN interface and/or mass data storage of the cellular phone 450. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices (for example, hard disk drives [HDDs] and/or DVDs). At least one HDD may have the configuration shown in FIG. 6A and/or at least one DVD may have the configuration shown in FIG. 6B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 6F:
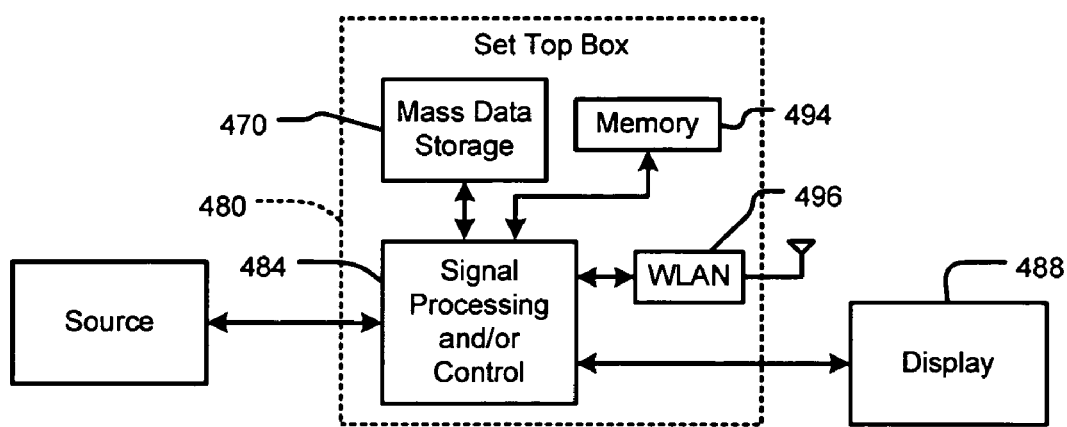

Referring now to FIG. 6F, the present invention can be implemented in an IC device for a set top box 480. The present invention may implement either or both signal processing and/or control circuits, which are generally identified in FIG. 6F at 484, a WLAN interface and/or mass data storage 470 of the set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices (for example, hard disk drives [HDDs] and/or DVDs). At least one HDD may have the configuration shown in FIG. 6A and/or at least one DVD may have the configuration shown in FIG. 6B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 6G:
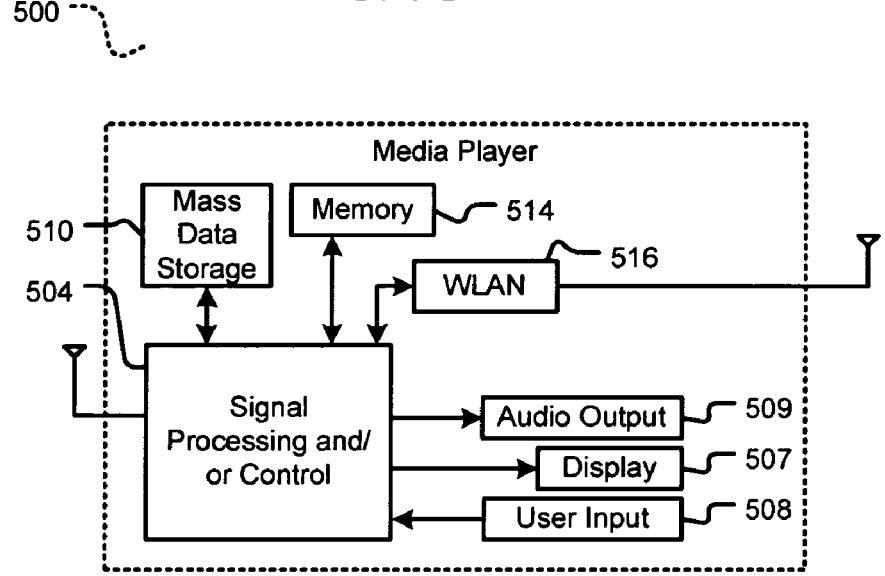

Referring now to FIG. 6G, the present invention can be implemented in an IC device for a media player 500. The present invention may implement either or both signal processing and/or control circuits, which are generally identified in FIG. 6G at 504, a WLAN interface 516 and/or mass data storage 510 of the media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 6A and/or at least one DVD may have the configuration shown in FIG. 6B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

CONCLUSION/SUMMARY

Thus, the present invention provides an integrated circuit device, systems incorporating the integrated circuit device, and methods for forming and testing the integrated circuit device. The integrated circuit device comprises two dies, the first including a first plurality of exposed terminals, and the second including a second plurality of exposed terminals (at least one of which is in electrical communication with at least one of the first plurality of terminals), a plurality of input and/or output (I/O) circuits (at least one of which is in electrical communication with at least one of the second plurality of terminals), and a plurality of I/O terminals (at least one of which is in electrical communication with at least one of the I/O circuits). The present invention advantageously provides the ability to fabricate the second die using different (e.g., less advanced and/or less expensive) manufacturing processes than those used to fabricate the first die. Thus, I/O circuits (e.g., protective structure such as electrostatic discharge protection devices and/or other I/O protection circuits) and/or other structures whose size may not change with smaller process technologies can be fabricated separately from circuits in the first die. Accordingly, space on the first die is not consumed by structures which do not substantially benefit from smaller (and/or more expensive) process technology.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An integrated circuit, comprising:
    a) a first semiconductor die comprising a first plurality of exposed terminals and a plurality of features having a first minimum feature size less than or equal to 0.13 µm; and
    b) a second semiconductor die comprising:
        i) a second plurality of exposed terminals, wherein at least one of said second plurality of exposed terminals is in electrical communication with one or more of said first plurality of exposed terminals,
        ii) a plurality of input and/or output (I/O) circuits, wherein at least one of said I/O circuits is in electrical communication with said at least one of said second plurality of exposed terminals, and
        iii) a plurality of I/O terminals, wherein at least one of said I/O terminals is in electrical communication with said at least one of said I/O circuits,
        wherein all features on the second die have a second minimum feature size greater than or equal to 0.18 µm.

2. The integrated circuit of claim 1, wherein at least one of said plurality of I/O circuits comprises a protective device.

3. The integrated circuit of claim 2, wherein said protective device comprises an electrostatic discharge (ESD) protection structure.

4. The integrated circuit of claim 2, wherein said protective device comprises one or more passive protection components.

5. The integrated circuit of claim 2, wherein said protective device comprises one or more active protection components.

6. The integrated circuit of claim 1, wherein at least one of said plurality of I/O circuits comprises an I/O driver circuit.

7. The integrated circuit of claim 1, wherein
    a) said first plurality of exposed terminals are on a first surface of said first die;
    b) said second plurality of exposed terminals are on a first surface of said second die; and
    c) said first surface of said first die faces said first surface of said second die.

8. The integrated circuit of claim 1, wherein
    a) said first plurality of exposed terminals are on a first surface of said first die;
    b) said second plurality of exposed terminals are on a first surface of said second die; and
    c) said plurality of I/O terminals are on a second surface of said second die opposite to said first surface of said second die.

9. The integrated circuit of claim 8, wherein said first plurality of exposed terminals and said second plurality of exposed terminals are aligned and bonded to each other.

10. The integrated circuit of claim 1, wherein said I/O terminals comprise bond pads, and integrated circuit further comprises at least one I/O wire bonded to at least one of said bond pads.

11. The integrated circuit of claim 1, wherein said second die has a recessed region containing at least a subset of said second plurality of exposed terminals, in electrical communication with at least a subset of said first plurality of exposed terminals.

12. A transceiver, comprising:
    a) the integrated circuit of claim 1;
    b) a transmitter communicatively coupled to at least a first one of said I/O terminals, configured to transmit data to a network; and
    c) a receiver communicatively coupled to at least a second one of said I/O terminals, configured to receive data from said network.

13. The transceiver of claim 12, further comprising a phase locked loop (PLL) configured to provide a reference clock signal to the transmitter and the receiver.

14. A system for transferring data on or across a network, comprising:
    a) the transceiver of claim 12,
    b) at least one transmitter port communicatively coupled to the transmitter for transmitting serial data to an external receiver, and
    c) at least one receiver port communicatively coupled to the receiver for receiving data.

15. A network, comprising:
    a) a plurality of the systems of claim 14, communicatively coupled to each other, and
    b) a plurality of storage or communications devices, where each of the storage or communications devices is communicatively coupled to one of the systems.

16. The integrated circuit of claim 1, wherein said first and second semiconductor die are flip-chip bonded to each other.

17. The integrated circuit of claim 1, wherein said exposed terminals of said first and second die comprise bump pads.

18. The integrated circuit of claim 17, wherein metal bumps are on one or both sets of said bump pads.

19. The integrated circuit of claim 1, wherein said first plurality of exposed terminals are arranged in an x-by-y array of terminals.

20. The integrated circuit of claim 19, wherein x and y are independent of each other and are integers of at least 4.

21. The integrated circuit of claim 20, wherein x and y are independent of each other and are integers of at least 12.

22. The integrated circuit of claim 19, wherein said first semiconductor die array has no terminals at points corresponding to corners of said array.

23. The integrated circuit of claim 19, wherein said array of terminals has one or more gaps or open spaces in the middle of said array.

24. The integrated circuit of claim 19, wherein said second plurality of exposed terminals are arranged in an x'-by-y' array of terminals.

25. The integrated circuit of claim 24, wherein x' and y' are independent of each other and are integers of at least 4.

26. The integrated circuit of claim 25, wherein x' and y' are independent of each other and are integers of at least 12.

27. The integrated circuit of claim 24, wherein said first and second semiconductor dies have no terminals at points corresponding to corners of said arrays.

28. The integrated circuit of claim 24, wherein said array of terminals has one or more gaps or open spaces in the middle of said array.

29. The integrated circuit of claim 1, wherein said second die includes a via hole through which at least one of said I/O terminals is in electrical communication with at least one of said first plurality of exposed terminals.

30. The integrated circuit of claim 1, wherein said first semiconductor die comprises metal lines comprising copper.

31. The integrated circuit of claim 1, wherein said first minimum feature size is less than or equal to 90 nm.

32. The integrated circuit of claim 31, wherein said first minimum feature size is less than or equal to 65 nm.

33. The integrated circuit of claim 1, wherein said second minimum feature size is greater than or equal to 0.25 µm.

34. The integrated circuit of claim 1, wherein the plurality of features of the first semiconductor die comprise structures in active circuit components.

35. The integrated circuit of claim 33, wherein said second minimum feature size is greater than or equal to 0.35 µm.

36. The integrated circuit of claim 35, wherein the active circuit components comprise structures in transistors, switches and/or functional circuit blocks.

37. The integrated circuit of claim 34, wherein the features of the second semiconductor die comprise structures in electrostatic discharge protection devices, I/O buffers, driver circuits, resistors, capacitors, inductors, voltage regulators and/or charge pumps.

38. The integrated circuit of claim 1, wherein the first and second semiconductor dies are connected by metal bumps.

39. The integrated circuit of claim 1, wherein each of the first and second pluralities of exposed terminals comprise bond pads; electrical connections between the bond pads on the first semiconductor die and the second semiconductor die comprise metal bumps, metal balls or wire bonds; the plurality of features of the first semiconductor die are connected to the first plurality of exposed terminals through a first plurality metal lines; and the features of the second semiconductor die are connected to the second plurality of exposed terminals through a second plurality of metal lines.

40. An integrated circuit, comprising:
   a) a first semiconductor die comprising a first plurality of exposed terminals and a plurality of features having a first minimum feature size less than or equal to 0.13 µm, but having no electrostatic discharge (ESD) circuits thereon; and
   b) a second semiconductor die comprising:
      i) a second plurality of exposed terminals, wherein at least one of said second plurality of exposed terminals is in electrical communication with one or more of said first plurality of exposed terminals,
      ii) a plurality of ESD circuits, wherein at least one of said ESD circuits is in electrical communication with said at least one of said second plurality of exposed terminals, and
      iii) a plurality of I/O terminals, wherein at least one of said I/O terminals is in electrical communication with said at least one of said I/O circuits,
   wherein all features on the second die have a second minimum feature size greater than or equal to 0.18 µm.

41. The integrated circuit of claim 40, wherein said second die has no bond pads, said I/O terminals comprise bond pads, and integrated circuit further comprises at least one I/O wire bonded to at least one of said bond pads.

42. The integrated circuit of claim 40, wherein the plurality of features of the first semiconductor die comprise structures in active circuit components.

43. The integrated circuit of claim 42, wherein the active circuit components comprise structures in transistors, switches and/or functional circuit blocks.

44. The integrated circuit of claim 42, wherein the features of the second semiconductor die comprise structures in electrostatic discharge protection devices, I/O buffers, driver circuits, resistors, capacitors, inductors, voltage regulators and/or charge pumps.

45. The integrated circuit of claim 40, wherein the first and second semiconductor dies are connected by metal bumps.

46. The integrated circuit of claim 40, wherein each of the first and second pluralities of exposed terminals comprise bond pads; electrical connections between the bond pads on the first semiconductor die and the second semiconductor die comprise metal bumps, metal balls or wire bonds; the plurality of features of the first semiconductor die are connected to the first plurality of exposed terminals through a first plurality metal lines; and the features of the second semiconductor die are connected to the second plurality of exposed terminals through a second plurality of metal lines.

47. An apparatus for testing a semiconductor die, wherein said semiconductor die has no electrostatic discharge (ESD) protection structures therein capable of protecting said die from typical electrostatic discharges, said apparatus comprising:
   a) a probe tip configured to contact an exposed terminal on a surface of said semiconductor die, said semiconductor die comprising a plurality of features having a first minimum feature size less than or equal to 0.13 µm;
   b) a probe head comprising an ESD protection structure in electrical communication with said probe tip, the probe tip being on a first surface of the probe head; and
   c) an electronic signal conduit in electrical communication with said ESD protection structure and said probe tip.

48. The apparatus of claim 47, further comprising a plurality of I/O terminals on a second surface of said probe head.

49. The apparatus of claim 48, wherein said probe head further comprises via holes between said first and second surfaces of said probe head, and wherein said I/O terminal is in electrical communication with said probe tip through at least one of said via holes.

50. The apparatus of claim 47, wherein the plurality of features of the semiconductor die comprise structures in active circuit components.

51. The apparatus of claim 50, wherein the active circuit components comprise structures in transistors, switches and/or functional circuit blocks.

* * * * *